(12) United States Patent
Hashimoto

(10) Patent No.: US 9,496,202 B2
(45) Date of Patent: Nov. 15, 2016

(54) ELECTRONIC SUBSTRATE

(71) Applicant: Seiko Epson Corporation, Tokyo (JP)

(72) Inventor: Nobuaki Hashimoto, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/802,330

(22) Filed: Jul. 17, 2015

(65) Prior Publication Data

US 2015/0325499 A1 Nov. 12, 2015

Related U.S. Application Data

(60) Continuation of application No. 13/787,225, filed on Mar. 6, 2013, now Pat. No. 9,087,820, which is a continuation of application No. 12/782,076, filed on May 18, 2010, now Pat. No. 8,416,578, which is a division of application No. 11/480,217, filed on Jun. 30, 2006, now Pat. No. 7,746,663.

(30) Foreign Application Priority Data

Jul. 6, 2005  (JP) ................................. 2005-197393

(51) Int. Cl.
*H05K 7/00* (2006.01)
*H01L 23/48* (2006.01)
*H01L 23/498* (2006.01)
*H01L 25/16* (2006.01)

(52) U.S. Cl.
CPC ....... *H01L 23/481* (2013.01); *H01L 23/49827* (2013.01); *H01L 23/49838* (2013.01); *H01L 23/49894* (2013.01); *H01L 25/16* (2013.01); *H01L 2224/16* (2013.01); *H01L 2924/3011* (2013.01); *Y10T 29/49155* (2015.01); *Y10T 29/49165* (2015.01)

(58) Field of Classification Search
CPC ........ H05K 7/00; H05K 1/141; H05K 1/167; H05K 1/0231; H05K 1/0306; H01L 23/481; H01L 23/49827; H01L 23/49838; H01L 2924/01079
USPC .......................... 361/760–784, 792–795, 803
See application file for complete search history.

(56) References Cited

U.S. PATENT DOCUMENTS

| | | |
|---|---|---|
| 4,423,468 A | 12/1983 | Gatto et al. |
| 4,611,882 A | 9/1986 | Ushida |
| 4,795,670 A | 1/1989 | Nishigaki et al. |
| 5,562,973 A | 10/1996 | Nagasaka et al. |
| 5,827,605 A | 10/1998 | Nishide et al. |
| 5,896,650 A | 4/1999 | Nishide et al. |

(Continued)

FOREIGN PATENT DOCUMENTS

| | | |
|---|---|---|
| CN | 1518094 A | 8/2004 |
| CN | 1532924 A | 9/2004 |

(Continued)

*Primary Examiner* — Tuan T Dinh
(74) *Attorney, Agent, or Firm* — Harness, Dickey & Pierce, P.L.C.

(57) ABSTRACT

An electronic substrate includes: an electronic element provided on a first face of a semiconductor substrate having a through hole; a passive element provided on a second face of the semiconductor substrate; a first part of an interconnection pattern provided on the second face of the semiconductor substrate; an insulating layer provided on the second face of the semiconductor substrate; and a second part of the interconnection pattern provided on the insulating layer.

6 Claims, 10 Drawing Sheets

(56) References Cited

U.S. PATENT DOCUMENTS

| | | |
|---|---|---|
| 6,108,212 A | 8/2000 | Lach et al. |
| 6,434,730 B1 | 8/2002 | Ito et al. |
| 6,759,744 B2 | 7/2004 | Hirose |
| 6,768,205 B2 | 7/2004 | Taniguchi et al. |
| 6,800,650 B2 | 10/2004 | Boehringer et al. |
| 6,873,035 B2 | 3/2005 | Watanabe et al. |
| 6,889,155 B2 | 5/2005 | Ogino et al. |
| 6,982,487 B2 | 1/2006 | Kim et al. |
| 7,004,984 B2 * | 2/2006 | Fukuta ............... H01L 21/4857 156/79 |
| 7,029,946 B2 | 4/2006 | Murata |
| 7,233,065 B2 | 6/2007 | Watanabe et al. |
| 7,319,268 B2 | 1/2008 | Watanabe et al. |
| 7,335,592 B2 | 2/2008 | Kim et al. |
| 7,510,759 B2 | 3/2009 | Himori et al. |
| 8,284,566 B2 | 10/2012 | Hashimoto |
| 2007/0023895 A1 | 2/2007 | Watanabe et al. |

FOREIGN PATENT DOCUMENTS

| | | |
|---|---|---|
| JP | 05-029537 A | 2/1993 |
| JP | 06-053414 | 2/1994 |
| JP | 2002-164468 A | 6/2002 |
| JP | 2002-184933 A | 6/2002 |
| JP | 2003-78080 | 3/2003 |
| JP | 2003-124595 A | 4/2003 |
| JP | 2003-347410 A | 12/2003 |
| JP | 2005-012136 A | 1/2005 |
| JP | 05-029537 B2 | 9/2012 |

* cited by examiner

ELECTRONIC SUBSTRATE

CROSS-REFERENCE TO RELATED APPLICATIONS

This is a continuation application of U.S. Ser. No. 13/787,225 filed Mar. 6, 2013, which is a continuation application of U.S. Ser. No. 12/782,076 filed May 18, 2010, now U.S. Pat. No. 8,416,578 issued Apr. 9, 2013, which is a divisional application of U.S. Ser. No. 11/480,217 filed Jun. 30, 2006, now U.S. Pat. No. 7,746,663 issued Jun. 29, 2010, which claims priority to Japanese Patent Application No. 2005-197393, filed Jul. 6, 2005, all of which are incorporated herein by reference in their entireties.

BACKGROUND

1. Technical Field

The present invention relates to an electronic substrate, a manufacturing method for an electronic substrate, and an electronic device.

2. Related Art

Recently, as electronic devices are made smaller and more sophisticated, there are demands to reduce the size of semiconductor packages themselves and increase their density.

Japanese Unexamined Patent Application, First Publication No. 2002-164468 and Japanese Unexamined Patent Application, First Publication No. 2003-347410 disclose techniques for making a semiconductor device (electronic substrate) smaller and more sophisticated by forming an inductor element on an active face (main face) of the substrate.

However, such conventional techniques have problems such as the following.

Since a passive element such as an inductor element is arranged near the active element, electrical coupling occurs between the passive and active elements, leading to possible deterioration in the characteristics of the active element and the overall characteristics of the semiconductor device using this substrate.

For example, in the above techniques, current leaking from the inductor element may cause transistor characteristics and the like to fluctuate.

SUMMARY

An advantage of some aspects of the invention is to provide an electronic substrate, a manufacturing method for an electronic substrate, and electronic device, which can suppress deterioration of the characteristics of the active element even when the passive element is provided on the substrate.

A first aspect of the invention provides an electronic substrate including: a substrate having a first face on which an active region is formed, and a second face on an opposite side to the first face and on which a passive element is formed.

Therefore, in the electronic substrate of the invention, there is a greater distance between an active element formed in the active region of the first face (e.g., an element which is formed by interconnections on the substrate or mounted as a chip component) and a passive element formed on the second face on the opposite side of the substrate with respect to the first face.

This makes electrical coupling less likely between the passive element and the active element.

Consequently, the invention can suppress deterioration in characteristics of the active element, and in characteristics of the overall system in which the electronic substrate is packaged in.

It is preferable that the electronic substrate of the first aspect of the invention further include: a penetrative conductive portion penetrating through the substrate; and an electrode formed on the first face, the passive element be electrically connected to the electrode via the penetrative conductive portion.

This can easily ensure an electrical connection between the passive element and other elements via the electrode formed on the first face.

It is preferable that the electronic substrate of the first aspect of the invention further include: an interconnection pattern arranged on or above the second face of the substrate, the passive element be configured from one part of the interconnection pattern.

The passive element can be formed using the interconnection pattern arranged on the second face side of the substrate or by connection, whichever is appropriate.

This makes it possible to obtain a thinner electronic substrate.

It is preferable that, in the electronic substrate of the first aspect of the invention, the interconnection pattern be formed by laminated layers, and the passive element is configured from one part of the interconnection pattern.

When using the interconnection pattern to form the passive element, the passive element can be formed using the interconnection pattern laminated from the plurality of layers or by connection, whichever is appropriate.

In this configuration, a capacitor or the like can easily be formed by, for example, arranging a dielectric layer (insulating layer) between the interconnection patterns.

Instead of using an interconnection pattern to form the passive element, a chip component having the functions of the passive element may be packaged on the second face of the substrate.

It is preferable that the electronic substrate of the first aspect of the invention further include: an external connection terminal, at least one part of the interconnection pattern be the external connection terminal.

It is preferable that the electronic substrate of the first aspect of the invention further include: an electronic component packaged on the surface of the external connection terminal.

It is preferable that, in the electronic substrate of the first aspect of the invention, the passive element be contained in the electronic component.

In this configuration, it is easy to achieve electrical connection between other electronic components and the passive element, and between other electronic components and the active element.

It is preferable that, in the electronic substrate of the first aspect of the invention, a plurality of the substrates be connected together via the external connection terminal and be laminated.

This makes it easy to form a module having a multilayered substrate which is configured by laminating a plurality of substrates.

It is preferable that the electronic substrate of the first aspect of the invention further include: a stress-relieving layer provided on the second face of the substrate, at least one part of the passive element be formed on the stress-relieving layer.

In this configuration, even if a thermal stress acts on the second face of the substrate, reduction of the reliability and life of the passive element can be suppressed.

When the stress-relieving layer is an insulating layer, electrical coupling between the passive element and the active element is even less likely to occur. This obtains advantages that deterioration in the characteristics and the like of the passive element can be prevented, floating capacitance from the passive element can be reduced, etc.

It is preferable that the electronic substrate of the first aspect of the invention further include: a ground electrode film formed on the second face of the substrate.

In this configuration, an electromagnetic shield effect can be obtained between the passive element and elements formed on the first face of the substrate, such as the active element.

It is preferable that, in the electronic substrate of the first aspect of the invention, the ground electrode film be formed in correspondence with the arrangement of the active region formed on the first face of the substrate.

In addition to obtaining an effective electromagnetic shield effect for the active element, this is an effective countermeasure against noise.

It is preferable that, in the electronic substrate of the first aspect of the invention, the ground electrode film be formed according to specifications based on the impedance of elements arranged on or above the second face.

Therefore, the invention enables impedance of elements provided on the second face side of the substrate to be controlled by adjusting specifications of the ground electrode film, e.g., its thickness.

It is preferable that the electronic substrate of the first aspect of the invention further include: a protective film formed on the second face of the substrate and protecting at least the passive element.

Therefore, the invention can protect the passive element and prevent corrosion and short-circuiting.

It is preferable that the electronic substrate of the first aspect of the invention further include: a semiconductor element formed in the active region.

It is preferable that the electronic substrate of the first aspect of the invention further include: a semiconductor device packaged on the active region and including the semiconductor element.

In this case, the semiconductor element may be configured as a switching element such as a transistor, formed using an interconnection pattern in the active region, or a semiconductor device containing the semiconductor element may be packaged in the active region.

It is preferable that, in the electronic substrate of the first aspect of the invention, no semiconductor element be packaged on the substrate.

It is preferable that the electronic substrate of the first aspect of the invention further include: a second passive element provided on the first face of the substrate.

It is preferable that, in the electronic substrate of the first aspect of the invention, the second passive element be configured from one part of an interconnection pattern arranged on or above the first face of the substrate.

It is preferable that, in the electronic substrate of the first aspect of the invention, the second passive element be provided in a device packaged on or above the first face of the substrate.

A second aspect of the invention provides an electronic device including: the above described electronic substrate packaged in the electronic device.

Therefore, the invention can suppress deterioration in characteristics of the active element, and in characteristics of the overall system which the electronic substrate is packaged in.

A third aspect of the invention provides a manufacturing method for electronic substrate, including: forming an active region on a first face of a substrate; and forming a passive element on a second face of the substrate.

It is preferable that the electronic substrate of the first aspect of the invention further include: forming an electrode on the first face; and forming a penetrative conductive portion penetrating through the substrate and connecting the electrode to the passive element.

It is preferable that the electronic substrate of the first aspect of the invention further include: forming a ground electrode film on the second face of the substrate.

Therefore, in the electronic substrate of the invention, there is a greater distance between an active element formed in the active region of the first face and a passive element formed on the second face on the opposite side of the substrate with respect to the first face.

This makes electrical coupling less likely between the passive element and the active element.

Consequently, the invention can suppress deterioration in characteristics of the active element, and in characteristics of the overall system in which the electronic substrate is packaged in.

DESCRIPTION OF EXEMPLARY EMBODIMENTS

Embodiments of an electronic substrate, a manufacturing method of the electronic substrate, and an electronic device according to the invention are explained with reference to FIGS. 1 to 9.

In the example described below, a semiconductor device element is provided on an active region of a substrate, and passive elements including a capacitor and a coil (inductor) are formed using an interconnection pattern.

First Embodiment

Figure 1:
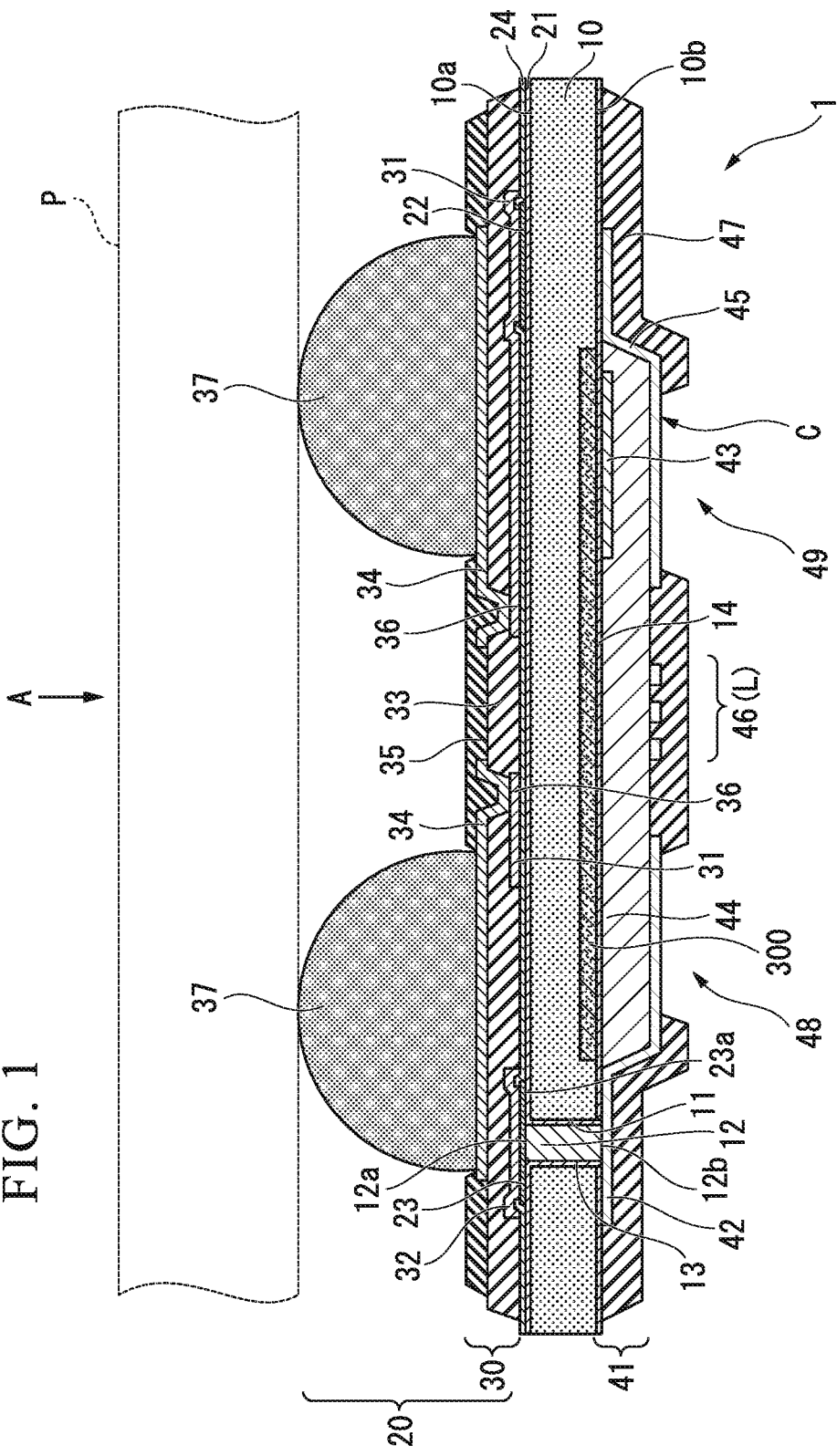
FIG. 1 is a cross-sectional view of a semiconductor device of a first embodiment of the invention.

FIG. 1 is a cross-sectional view of a semiconductor device 1 (electronic substrate) in which a semiconductor element is formed on a silicon substrate.

As shown in FIG. 1, the semiconductor device 1 includes a silicon substrate 10 (substrate), a connection section 20 formed on a first face 10a of the silicon substrate 10, and an interconnection section 41 formed on a second face 10b of the silicon substrate 10.

The connection section 20 is electrically connected to an external apparatus P such as a printed wiring board.

The interconnection section 41 includes a land for packaging.

A semiconductor element such as an integrated circuit includes a transistor, a memory element, and the like, and is formed in a predetermined region (active region) of the first face 10a of the silicon substrate 10.

A groove 11 penetrating through the silicon substrate 10 in its thickness direction is formed in the silicon substrate 10.

A conductive portion 12 (penetrative conductive portion) is formed by filling the groove 11 with a conductive material.

An insulating film 13 is formed on side walls of the groove 11, and keeps the conductive portion 12 electrically insulated from the silicon substrate 10.

A lower-face insulating layer 14 is formed over the surface of the second face 10b of the silicon substrate 10 while avoiding the region on which the groove 11 is formed.

The connection section 20 includes a foundation layer 21 (passivation), a first electrode 22, a second electrode 23, a first insulating layer 24, and an interconnection section 30.

The foundation layer 21 is formed on the first face 10a of the silicon substrate 10.

The first electrode 22 and the second electrode 23 are each formed in a plurality of regions on the foundation layer 21.

The first insulating layer 24 is formed so as to avoid the regions on which the first electrode 22 and the second electrode 23 are formed.

The interconnection section 30 is formed on the first insulating layer 24.

The foundation layer 21 is formed using an insulating material, such as silicon dioxide ($SiO_2$) and silicon nitride ($Si_3N_4$).

A material such as titanium (Ti), titanium nitride (TiN), aluminum (Al), copper (Cu), or an alloy of these, may be used for the first electrode 22 and the second electrode 23.

Figure 2:
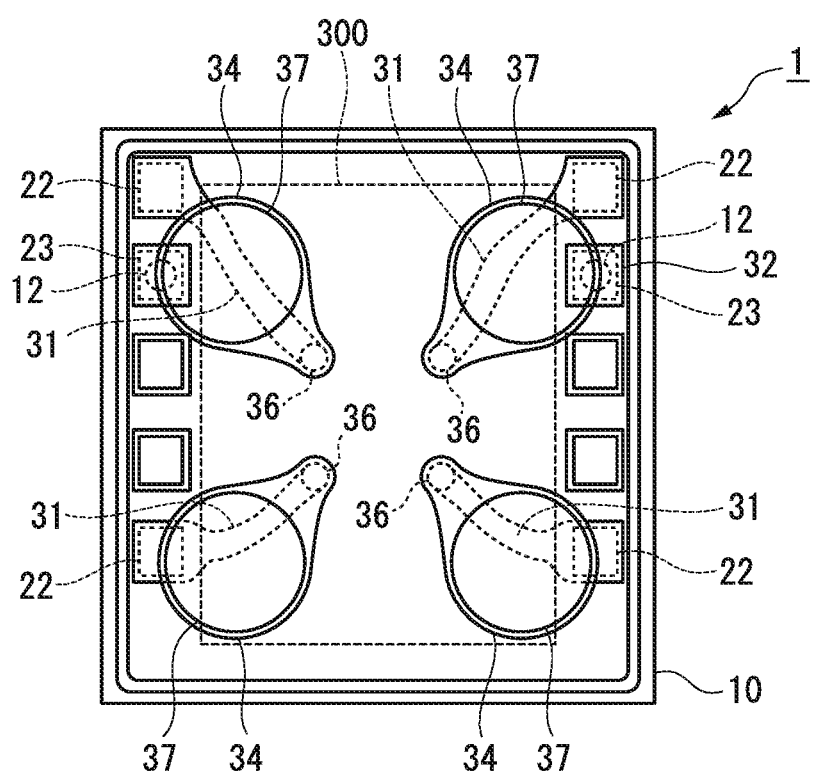
FIG. 2 is a view of the semiconductor device from the direction of arrow A of FIG. 1.

As shown in plan view in FIG. 2, a plurality of electrodes may be formed on the silicon substrate 10.

This embodiment describes only the first electrode 22 and the second electrode 23.

The second electrode 23 may be covered by the first insulating layer 24.

The first electrode 22 and the second electrode 23 are electrically connected to a semiconductor element such as the integrated circuit mentioned above.

As shown in FIGS. 1 and 2, the interconnection section 30 includes a first interconnection 31, a metal film 32, a second insulating layer 33 (stress-relieving layer), a second interconnection 34, and a third insulating layer 35.

The first interconnection 31 is electrically connected to the first electrode 22 formed on the first insulating layer 24.

The metal film 32 is formed on a top face of the second electrode 23.

The second insulating layer 33 is formed on the first interconnection 31 and the metal film 32.

The second interconnection 34 is formed on the second insulating layer 33, and is electrically connected to the first interconnection 31.

The third insulating layer 35 is formed on the second interconnection 34.

One part of the first interconnection 31 is exposed from the second insulating layer 33 to form a land section 36.

The land section 36 and the second interconnection 34 are electrically connected.

Bumps 37 are formed on the second interconnection 34.

The semiconductor device 1 is electrically connected via these bumps 37 to the external apparatus P such as a printing wiring board.

The third insulating layer 35 is formed on the second insulating layer 33 and on one part of the second interconnection 34, and is formed so as to avoid regions of the second interconnection 34 on which the bumps 37 are formed.

The first electrode 22 is electrically connected to the bumps 37 via the first interconnection 31 and the second interconnection 34.

The second electrode 23 is formed on the foundation layer 21 formed on the first face 10a of the silicon substrate 10.

One part (rear face side) of the second electrode 23 is exposed to the groove 11.

Consequently, a rear face 23a of the second electrode 23 electrically connects to the first end 12a of the conductive portion 12 in the groove 11.

The second end 12b of the conductive portion 12 is electrically connected to an interconnection 42 formed on the second face 10b of the silicon substrate 10.

That is, the second electrode 23 can be electrically connected to an electronic element 300 provided on the second face 10b of the silicon substrate 10.

As materials of the first interconnection 31 and the second interconnection 34, gold (Au), copper (Cu), titanium (Ti), tungsten (W), titanium tungsten (TiW), titanium nitride (TiN), nickel (Ni), nickel vanadium (NiV), chrome (Cr), aluminum (Al), and palladium (Pd), can be used.

The first interconnection 31 and the second interconnection 34 may include a single-layer structure of one of the above materials, or a multilayer structure obtained by combining a plurality of them.

The first insulating layer 24, the second insulating layer 33, and the third insulating layer 35 may be formed from a resin (synthetic resin).

The first insulating layer 24, the second insulating layer 33, and the third insulating layer 35 can be formed from any type of insulating material such as polyimide resin, silicone-modified polyimide resin, epoxy resin, silicone-modified epoxy resin, acrylic resin, phenol resin, benzocyclobutene (BCB), and polybenzoxazole (PBO).

The first insulating layer 24 may be formed from an insulating material such as silicon oxide ($SiO_2$) and silicon nitride ($Si_3N_4$).

It is preferable that the material used for the metal film 32 be the same as the material used for the first interconnection 31 and the second interconnection 34.

As the material of the metal film 32A, Au, TiW, Cu, Cr, Ni, Ti, W, NiV, and Al can be used.

The metal film 32 can also be formed by laminating these metals.

Incidentally, it is preferable that the metal film 32 (in the case of a laminated structure, at least one layer thereof) be formed using a material having higher resistance to corrosion than the electrodes, such as Au, TiW, and Cr.

This can prevent corrosion of the electrodes and generation of electrical faults.

The interconnection section 41 includes a foundation layer 14 (rear face insulating layer, passivation), an interconnection 43 (interconnection pattern), an insulating layer 44, interconnections 42 and 45, interconnections (interconnection patterns) 42, 45, and 46, and an insulating layer 47 covering part of the foundation layer 14.

The foundation layer 14 is formed on the second face 10b of the silicon substrate 10.

The interconnection 43 is formed on the foundation layer 14.

The insulating layer 44 is formed on the foundation layer 14 and covers the interconnection 43.

The interconnections 42 and 45 are formed on the foundation layer 14 and on the insulating layer 44.

The interconnection 46 is formed on the insulating layer 44.

The insulating layer 47 covers the interconnections 42, 45, and 46, and part of the foundation layer 14.

A first end of the interconnection 42 is formed on the foundation layer 14 and electrically connected to the second end 12b of the conductive portion 12.

A second end of the interconnection 42 is arranged on the insulating layer 44.

One part of the interconnection 42 is exposed on the insulating layer 44 via an opening in the insulating layer 47.

This forms a land section 48 (external connection terminal) which is exposed from the opening in the insulating layer 47.

Ends of the interconnection 45 are formed on the insulating layer 44 and are faced the interconnection 43 via the insulating layer 44.

That is, the interconnection 45 and the interconnection 43 face each other with the insulating layer 44 therebetween, forming a laminated capacitor C (passive element).

Here, a dielectric substance is used to form the insulating layer 44.

Similar to the first insulating layer 24, the second insulating layer 33, and the third insulating layer 35 described above, the insulating layers 44 and 47 and the foundation layer 14 can be formed from any type of dielectric insulating material such as polyimide resin, silicone-modified polyimide resin, epoxy resin, silicone-modified epoxy resin, acrylic resin, phenol resin, benzocyclobutene (BCB), and polybenzoxazole (PBO).

One part of the interconnection 45 is exposed on the insulating layer 44 via an opening in the insulating layer 47.

This forms a land section (external connection terminal) 49 which is exposed from the opening in the insulating layer 47.

The interconnection 46 forms a spiral inductor (passive element) L or the like.

Incidentally, FIG. 1 depicts the inductor L in simplification.

The capacitor C and the inductor L are connected via a penetrative conductive portion (not shown) to a semiconductor element and the first electrode 22 formed on the first face 10a side.

Similar to the first interconnection 31 and the second interconnection 34 described above, the interconnections 42, 43, 45, and 46 are formed from a single-layer material such as gold (Au), copper (Cu), titanium (Ti), tungsten (W), titanium tungsten (TiW), titanium nitride (TiN), nickel (Ni), nickel vanadium (NiV), chrome (Cr), aluminum (Al), and palladium (Pd), or from a multilayered structure obtained by combining a plurality of these materials.

Subsequently, a manufacturing method for the semiconductor device 1 is explained with reference to FIGS. 3A to 6.

Figure 6:
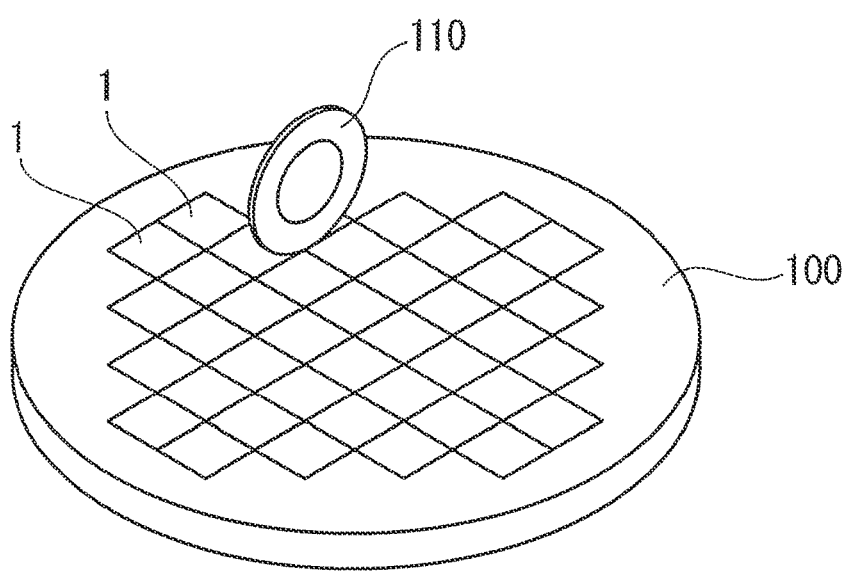
FIG. 6 is a perspective view of a manufacturing method of the semiconductor device of the first embodiment.

As shown in FIG. 6, in this embodiment, a plurality of the semiconductor devices 1 is formed simultaneously on the same silicon substrate (substrate) 10.

The explanation of FIGS. 3A to 5C describes the formation of one semiconductor device 1.

Figure 3A:
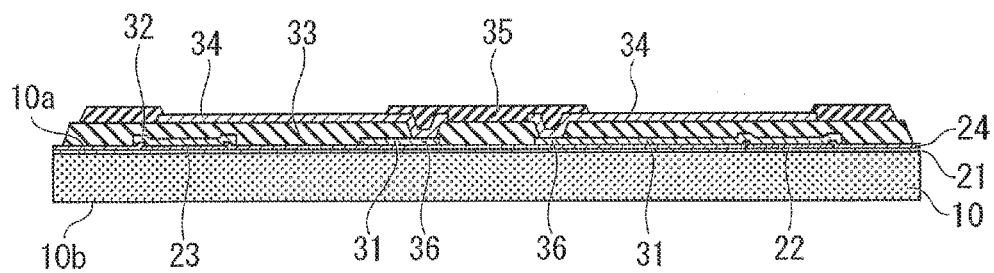
FIGS. 3A to 3C are cross-sectional views of a manufacturing method of the semiconductor device of the first embodiment.

As shown in FIG. 3A, after forming the foundation layer 21 on the first face 10a of the silicon substrate 10, the first electrode 22 and the second electrode 23 are formed on the foundation layer 21.

The first insulating layer 24 is then formed on the first electrode 22 and the second electrode 23, and insulating material covering them is removed by conventional methods of photolithography and etching.

It is not absolutely necessary to remove the insulating material covering the second electrode 23.

The first interconnection 31 is then formed on the first insulating layer 24 including the first electrode 22, and the metal film 32 is formed on the top face of the second electrode 23.

The first interconnection 31 is formed by a method such as sequential sputtering of TiW and Cu followed by plating of Cu.

The second insulating layer 33 is formed so as to cover the first interconnection 31 and the metal film 32, and regions of the second insulating layer 33 corresponding to the land sections 36 are removed by a conventional photolithography method, whereby parts of the first interconnection 31 are exposed and become the land sections 36.

The second interconnections 34 are formed on the second insulating layer 33 so as to connect to the land sections 36.

The third insulating layer 35 is formed so as to cover the second insulating layer 33 and the second interconnections 34 while avoiding the regions on which the bumps 37 are formed.

Figure 3B:
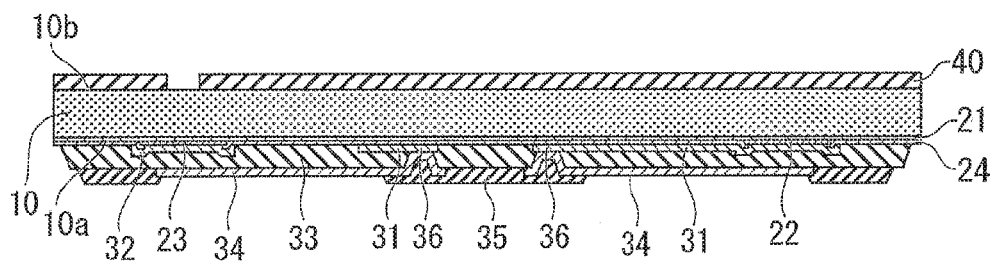

As shown in FIG. 3B, the second face 10b of the silicon substrate 10 is coated with a photo resist 40, and the photo resist 40 is then patterned.

Using the patterned photo resist 40 as a mask, dry etching is performed so as to remove parts of the silicon substrate 10 and the foundation layer 21 that correspond to the position of the second electrode 23.

Figure 3C:
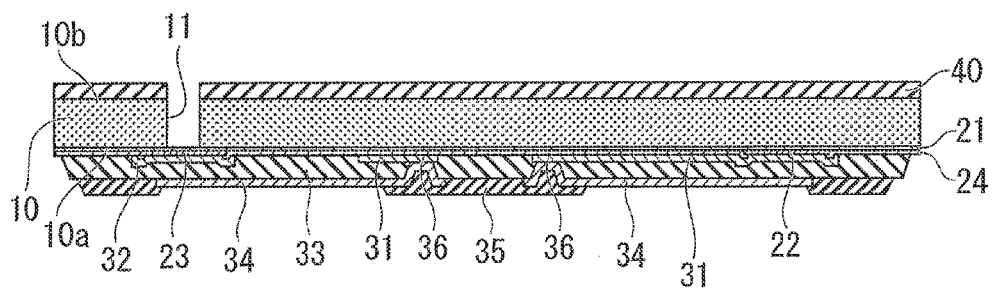

As shown in FIG. 3C, etching is performed until the rear face 23a of the second electrode 23 is exposed, and the groove 11 is formed and etched from the second face 10b of the silicon substrate 10 to the first face 10a.

While here the photo resist 40 is used as a mask, the invention is not limited to this configuration. For example, an $SiO_2$ film may be used as a hard mask, or a photo resist mask may be combined with a hard mask.

The etching method is not limited to dry etching, wet etching, laser processing, or both may be used.

Figure 4A:
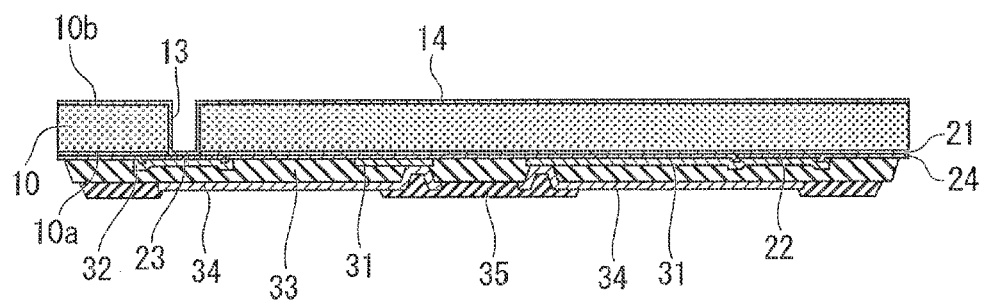
FIGS. 4A to 4C are cross-sectional views of a manufacturing method of the semiconductor device of the first embodiment.

As shown in FIG. 4A, a rear face insulating layer 14 (foundation layer) and an insulating film 13 are then formed on the second face 10b of the silicon substrate 10 and on inner walls of the groove 11.

The rear face insulating layer 14 and the insulating film 13 prevent corrosion of the silicon substrate 10 caused by current leaks, oxygen, water, and so on.

As materials for forming the rear face insulating layer 14 and the insulating film 13, tetra ethyl ortho silicate: $Si(OC_2H_5)_4$ (hereinafter TEOS) formed using plasma enhanced chemical vapor deposition (PECVD), i.e. PE-TEOS, and TEOS using ozone CVD, i.e. silicon oxide $(SiO_2)$ formed using $O_3$-TEOS and CVD, can be used.

The rear face insulating layer 14 and the insulating film 13 need only have insulating properties, other materials such as resin may be use.

Figure 4B:
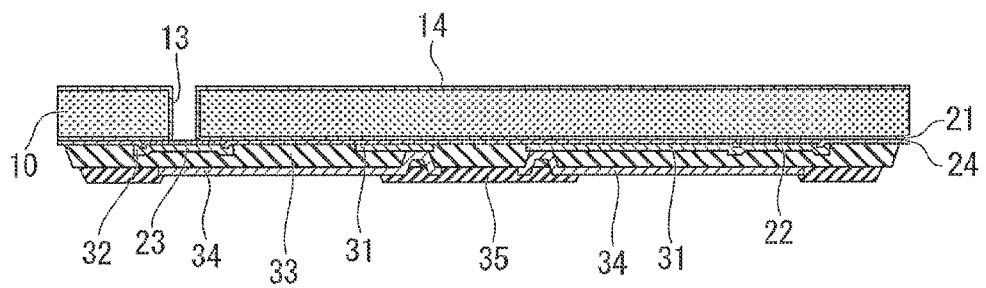

The insulating film 13 formed in the rear face 23a section of the second electrode 23 is removed by dry etching or laser processing such that the insulating film 13 remains only on the side walls of the groove 11 as shown in FIG. 4B.

Figure 4C:
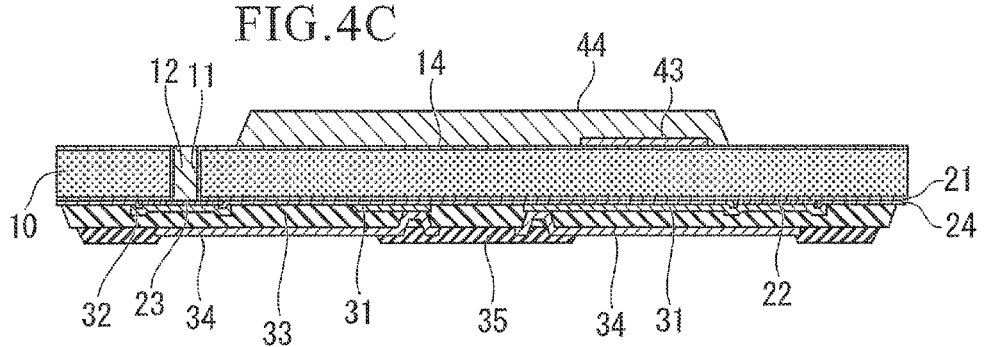

As shown in FIG. 4C, the inside of the groove 11 is plated using an electrochemical plating (ECP) method to form a conductive material for forming the conductive portion 12 in the groove 11.

The first end 12a of the conductive portion 12 and the second electrode 23 exposed in the groove 11 are electrically connected via the rear face 23a of the second electrode 23.

As the conductive material for forming the conductive portion 12, for example, copper (Cu) can be used. The groove 11 is filled with copper (Cu), the conductive portion 12 is formed in the groove 11.

The method of forming the conductive portion 12 in this embodiment includes, for example, a step of sputtering (laminating) TiN and Cu, and a step of plating Cu.

Alternatively, a step of sputtering (laminating) TiW and Cu, and a step of plating Cu may be included.

The described-above method of the forming of the conductive portion 12 is not limited. The groove 11 may be filled with a conductive paste, a molten metal, metal wiring, etc.

While in this embodiment, the groove 11 is filled with the conductive portion 12, it is unnecessary to fill completely. Instead, the conductive portion 12 may be formed along the inner walls of the groove 11 and electrically connected via the rear face 23a of the second electrode 23.

After the forming of the conductive portion 12, the interconnection 43 is formed on the second face 10b of the silicon substrate 10.

As forming method of the interconnection 43, sputtering, plating, and droplet discharge can be used.

After the forming of the interconnection 43, the insulating layer 44 is formed so as to cover the interconnection 43 and a region which is separated from the conductive portion 12.

The insulating layer 44 is formed using the same method as for the insulating layers 24, 33, and 35 mentioned above.

Figure 5A:
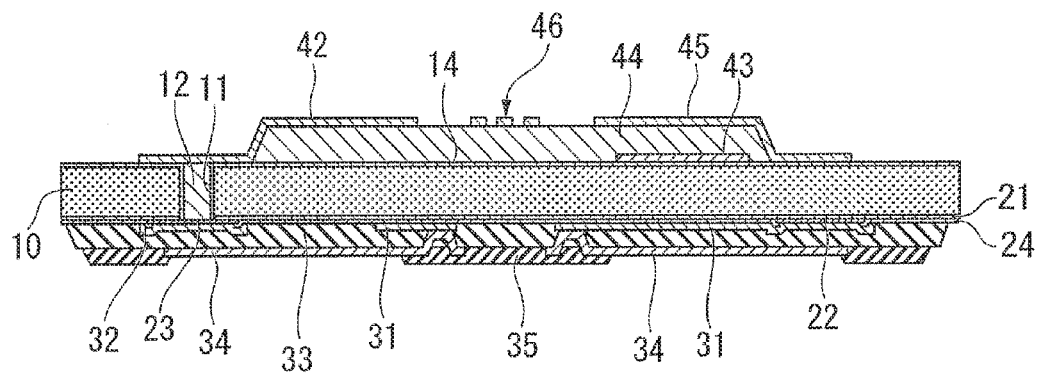
FIGS. 5A to 5C are cross-sectional views of a manufacturing method of the semiconductor device of the first embodiment.

As shown in FIG. 5A, the interconnection 46 is then formed on the insulating layer 44, and the interconnections 42 and 45 are formed with the rear face insulating layer 14 and the insulating layer 44 therebetween.

Similar to the interconnection 43, the interconnections 42 and 45 can be formed by a method such as sputtering, plating, and droplet discharge.

Figure 5B:
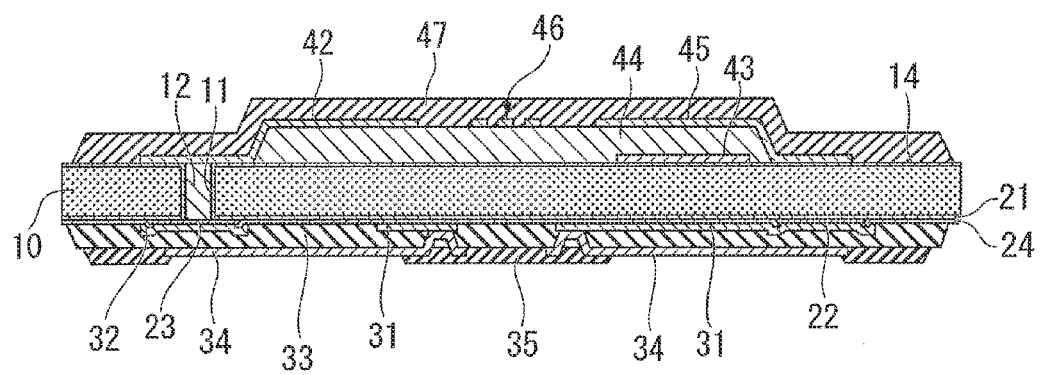

As shown in FIG. 5B, when the interconnections 42, 45, and 46 are formed, the insulating layer 47 is formed so as to cover them and part of the rear face insulating layer 14.

Figure 5C:
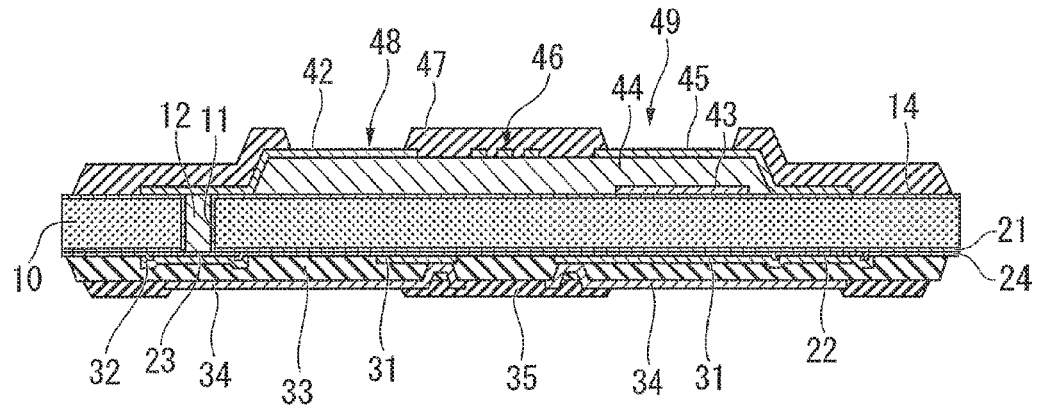

As shown in FIG. 5C, insulating material covering the interconnections 42 and 45 and corresponding to the land sections 48 and 49 is removed by conventional methods of photolithography and etching. The land sections 48 and 49 are formed.

Bumps of Pb-free solder or the like are mounted on the second interconnection 34 formed on the side of the first face 10a of the silicon substrate 10.

When the forming of the bumps 37, solder balls may be mounted on the second interconnection 34 or a solder paste may be printed on it.

As shown in FIG. 6, the above steps simultaneously form a plurality of semiconductor devices on a silicon substrate 100.

As shown in FIG. 6, a dicing device 110 is then used to dice (cut) the silicon substrate 100 into a plurality of individual semiconductor devices 1.

In this way, a plurality of semiconductor devices 1 can be formed almost simultaneously on the silicon substrate 100, which is then cut into individual semiconductor devices 1 to obtain the semiconductor device 1 of FIG. 1.

This enables the semiconductor device 1 to be manufactured efficiently, and reduces its cost.

As described above in this embodiment, passive elements including the capacitor C and the inductor L are formed on the second face 10b, and active elements such as semiconductor elements are formed in an active region on the first face 10a opposite the second face 10b.

Therefore, the active and passive elements can be separated by a wide distance with the silicon substrate 10 between them.

Consequently in this embodiment, electrical coupling between the active and passive elements is less likely to occur, and deterioration in the characteristics of the active elements can be suppressed.

Since this embodiment can suppress deterioration in the characteristics of an overall system (electro-optical device or electronic device) which includes the semiconductor device 1, it is possible to form an ultra high-density module.

In particular in this embodiment, since the semiconductor element is formed on the active region, a p-type or n-type semiconductor well layer is formed in the middle layer, it is possible to further suppress that electrical coupling will occur between the active elements and the passive elements.

Furthermore, in this embodiment, since the interconnections 45 and 46 forming some of the passive elements are arranged on the insulating layer 44 which functions as a stress-relieving layer, electrical coupling is less likely to occur between the rear side of the semiconductor element and the passive elements.

Therefore, reduction in the characteristics of the passive elements can be suppressed, and floating capacitance that is generated from the passive elements can be suppressed.

Furthermore, in this embodiment, the land sections 48 and 49 enable the semiconductor device 1 to be easily connected to other electronic components.

Second Embodiment

Subsequently, a second embodiment of a semiconductor device (electronic substrate) is explained with reference to FIG. 7.

Figure 7:
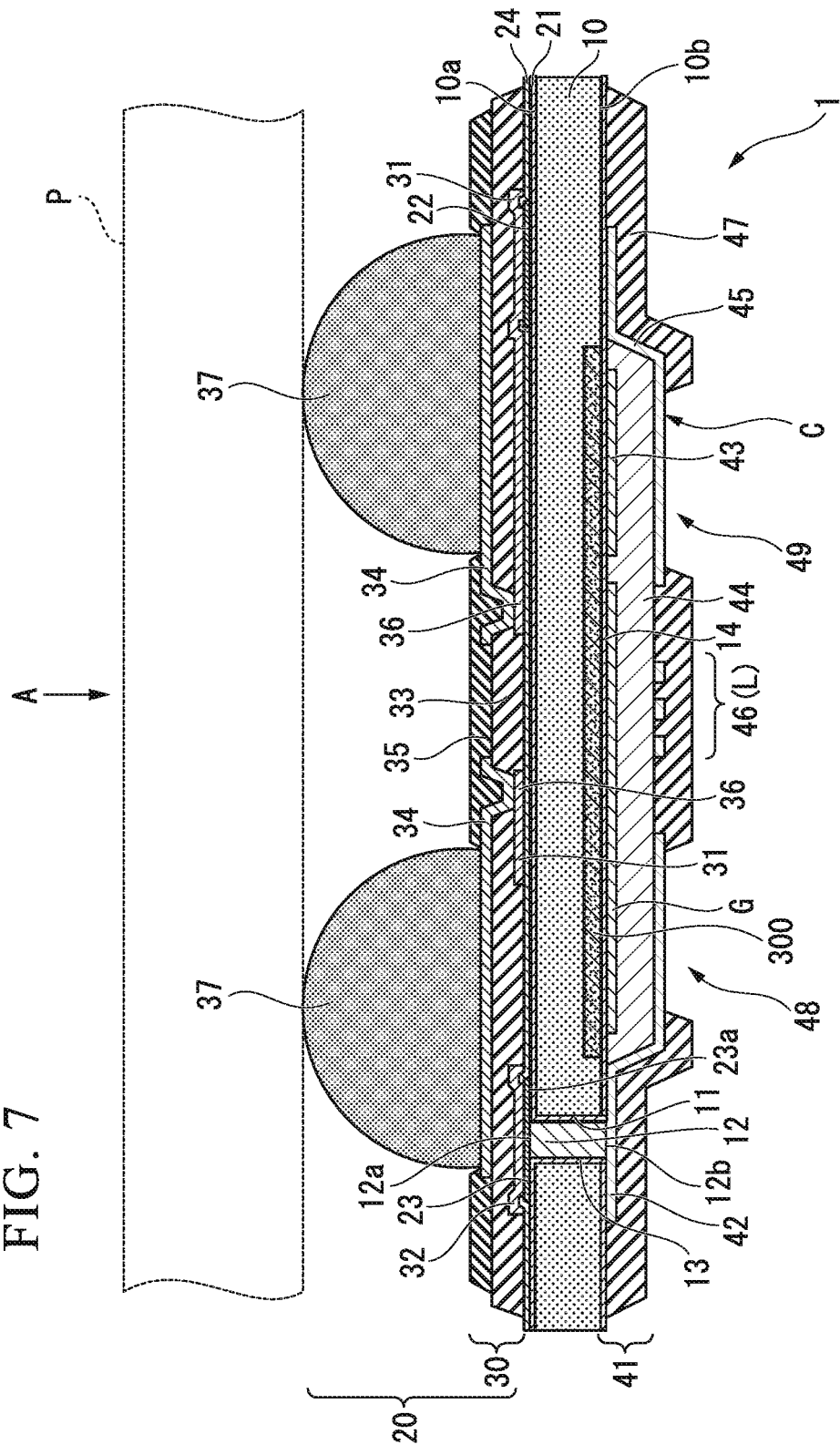
FIG. 7 is a cross-sectional view of a semiconductor device of a second embodiment.

In FIG. 7, like constituent parts to those of FIGS. 1 to 6 are designated with like reference numerals and are not repetitiously explained.

The semiconductor device 1 of the second embodiment includes a ground electrode film G.

As shown in FIG. 7, in this embodiment, the ground electrode film G is formed on the foundation layer 14.

The ground electrode film G is grounded by connecting it to a grounding wiring (not shown).

The ground electrode film G is formed in a region separated from the interconnection 43 by using the same forming step and by using same material as the interconnection 43.

More specifically, the ground electrode film G is arranged opposite the active region of the first face 10a, or between the active region and the passive elements.

In the semiconductor device 1 of this embodiment, the ground electrode film G functions as an electromagnetic shield, it is possible to suppress noise being transmitted from the passive elements to the active elements, and vice versa.

In this embodiment, impedance of electronic components (electronic elements) which are connected to the land sections 48 and 49 can be controlled by adjusting specifications such as growth thickness and size of the ground electrode film G.

Third Embodiment

Subsequently, a third embodiment of a semiconductor device (electronic substrate) is explained with reference to FIG. 8.

Figure 8:
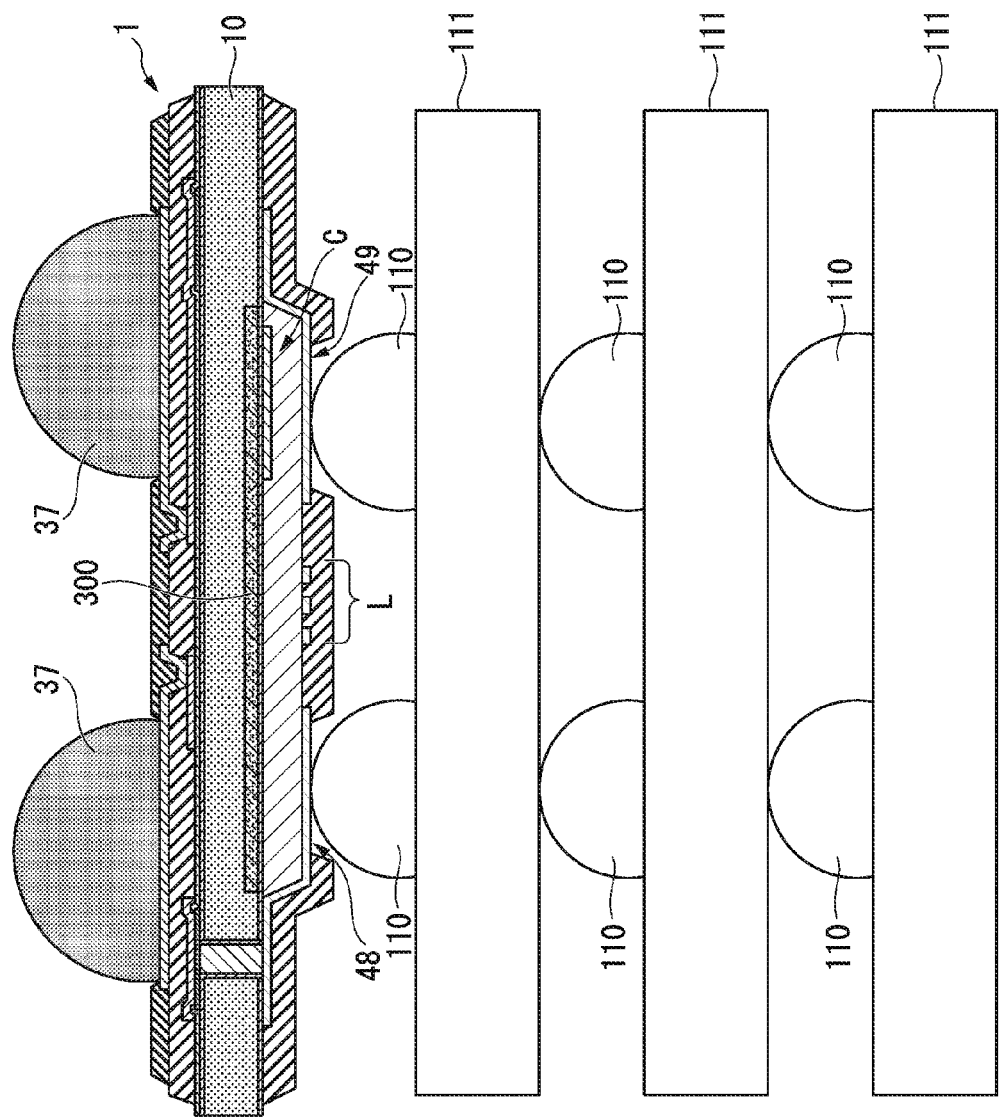
FIG. 8 is a cross-sectional view of a semiconductor device of a third embodiment.

In FIG. 8, a plurality of semiconductor elements 111 including bumps 110 are laminated in the thickness direction of the semiconductor device 1.

The bumps 110 are connected to the land sections 48 and 49 of FIG. 1.

This semiconductor device 1 constitutes a laminated-type semiconductor device.

Similar to the first embodiment, the semiconductor elements 111 may include active and passive elements, or only passive elements.

The semiconductor device 1 with the above configuration can further enhance the packaging density.

This embodiment also enables one system block to be constructed by laminating semiconductor devices having different functions.

Electronic Device

Figure 9:
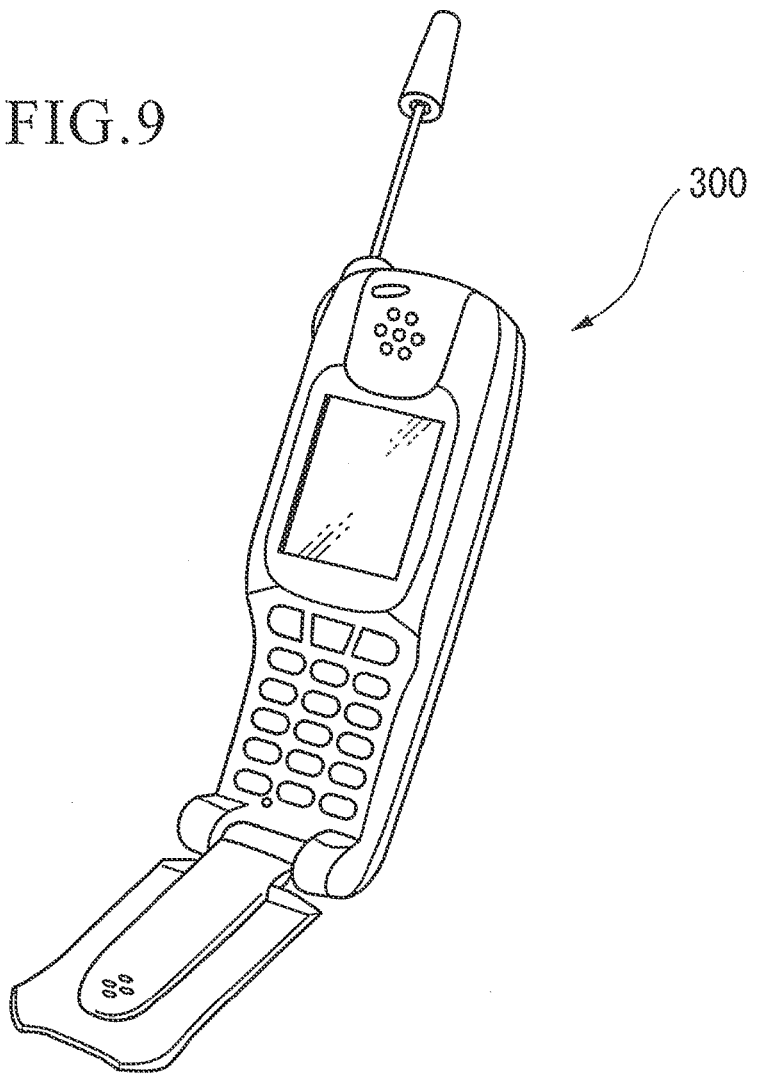
FIG. 9 is a perspective view of an electronic device in which an electronic substrate of the invention is packaged.

FIG. 9 is a perspective view of a mobile telephone 300. The mobile telephone 300 is an example of an electronic device which the above-mentioned semiconductor device 1 is packaged in.

By packaging the electronic component of this invention, which is made smaller, thinner, and more sophisticated, a small, high-quality mobile telephone 300 can be obtained.

In addition to a mobile telephone, the semiconductor device 1 can be packaged in an electronic device including an electro-optical device such as a liquid crystal display device, an organic electroluminescent display device, and a plasma-type display device.

While exemplary embodiments of the invention have been described above with reference to the accompanying drawings, these are not to be considered as limitative of the invention.

Shapes, combinations and the like of the constituent members illustrated above are merely examples, and various modifications based on design requirements and the like can be made without departing from the spirit or scope of the invention.

For example, while the above-described embodiments describe semiconductor devices in which a semiconductor element is contained in an electronic substrate, it is not absolutely necessary for the electronic substrate to contain the semiconductor element.

Instead, an external device such as a semiconductor device may be packaged in the active region.

It is not absolutely necessary for the electronic substrate according to the invention to include a semiconductor element.

For example, the invention may be configured as a silicon substrate wherein no external device is packaged in a mount region (active region) for an external device (unpackaged state), and passive elements are formed on a face on an opposite side to the mount region, e.g., a semiconductor chip.

While in the above-described embodiments, an active element such as a semiconductor element, the capacitor C, and the inductor L are contained in the silicon substrate 10, the invention is not limited to this configuration.

It is acceptable to package an active element, such as a semiconductor chip, in the active region, and to package a passive element chip having the functions of a capacitor, an inductor, and the like, on a face on an opposite side to the active region.

Figure 10:
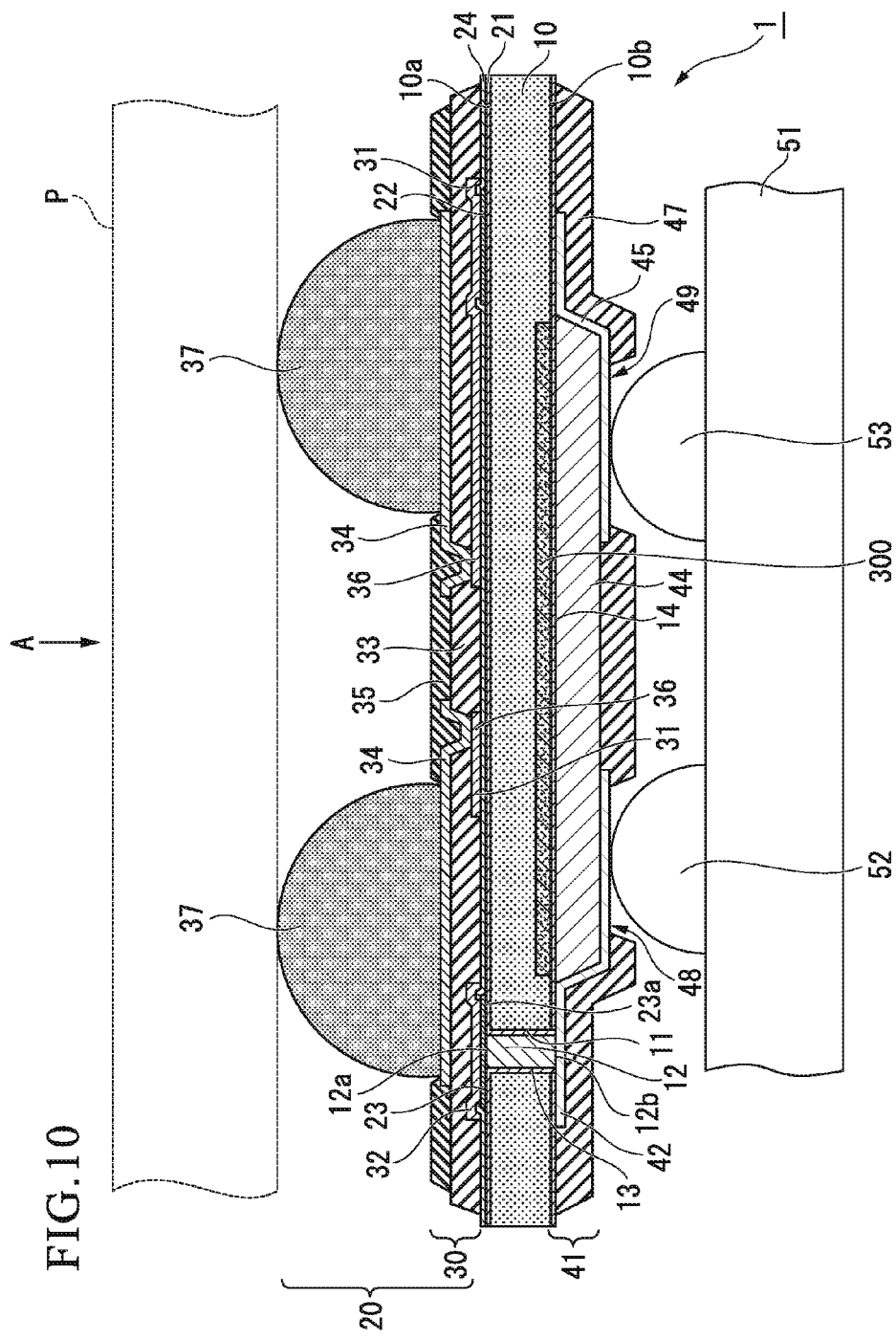
FIG. 10 is a cross-sectional view of an example of another embodiment of an electronic substrate.

As for example shown in FIG. 10, connection pads 52 and 52 of an electronic component 51 including the passive elements described-above may be connected at the surface of the land sections 48 and 49 of the silicon substrate 10 in a packaged configuration.

This configuration obtains the same effects and advantages as the above-described embodiments.

Furthermore, an electronic component which does no include passive elements (e.g., a semiconductor device) may be packaged on the surface of the land sections 48 and 49 of the silicon substrate 10 which contains the passive elements shown in FIG. 1.

While in the above-described embodiments, a semiconductor element is formed on the first face 10a of the silicon substrate 10, other electronic elements may be formed instead, the only requirement being that they do not interfere with the bumps 37, the second interconnections 34, and so on.

In this case, a semiconductor device and the passive elements mentioned-above can be selected as the electronic elements.

When providing a passive element as a second passive element on the first face 10a side, even when the passive element is formed using the interconnection 42, an electronic device including the second passive element may be packaged on the first face 10a in the same manner as on the second face 10b side.

While the above-described embodiments describe the capacitor C and the inductor L as examples of passive elements, in addition to these, a resistance can be formed by partially adjusting the thickness, width, and the like of the interconnection pattern.

While the above-described embodiments describe an example using a spiral inductor as the inductor L, a toroidal inductor may be formed and packaged instead.

While in the above-described embodiments, the conductive portion 12 penetrating through the silicon substrate 10 connects electrodes on the first face 10a side to passive elements on the second face 10b side, they may be connected without using a penetrative conductive portion such as the conductive portion 12 by, for example, using an interconnection pattern formed on a side face (end face) of the silicon substrate 10.

It is also acceptable to form a protective film by covering the second face 10b side of the silicon substrate 10 of the above-described embodiments with a resin material such as a solder resist.

It is preferable that this protective film cover at least the passive elements.

As forming method of the protective film, photolithography, droplet discharge, printing, and dispensing can be used.

While the above-described embodiments describe examples using a silicon substrate on which a semiconductor element is formed, an identical structure can be applied in substrates such as a compound semiconductor substrate, a glass substrate on which a semiconductor device such as poly-silicon is formed, a quartz substrate, and an organic substrate on which an organic semiconductor is formed.

What is claimed is:

1. An electronic substrate comprising:
a semiconductor substrate having a first face, a second face, and a through hole which communicatively interconnects the first face and the second face, the through hole having an inner wall;
an electronic element provided on the first face;
a first insulating layer provided over the first face of the semiconductor substrate;
a second insulating layer provided over the first insulating layer;
a first part of an interconnection pattern provided over the first insulating layer;
a second part of the interconnection pattern provided over the second insulating layer, the second part of the interconnection pattern being directly connected to the first part of the interconnection pattern; and
a third insulating layer covering a surface of the inner wall of the through hole.

2. The electronic substrate according to claim 1, wherein the second insulating layer is a resin.

3. The electronic substrate according to claim 1, wherein the electronic element is formed from a semiconductor element integrated with the semiconductor substrate.

4. The electronic substrate according to claim 1, further comprising:
an electrode on the second face of the semiconductor substrate; and
a penetrative conductive portion penetrating the semiconductor substrate and connecting the electrode to the first part of the interconnection pattern.

5. The electronic substrate according to claim 2, wherein the resin is one or more compounds selected from the group consisting of a polyimide resin, a silicone-modified polyimide resin, an epoxy resin, a silicone-modified epoxy resin, an acrylic resin, a phenol resin, benzocyclobutene, and polybenzoxazole.

6. The electronic substrate according to claim 1, further comprising:
a fourth insulating layer provided on the first part of the interconnection pattern.

* * * * *